United States Patent
Kishi

(10) Patent No.: US 11,990,495 B2
(45) Date of Patent: May 21, 2024

(54) IMAGE CAPTURING UNIT AND METHOD FOR MANUFACTURING THE SAME

(71) Applicant: CANON KABUSHIKI KAISHA, Tokyo (JP)

(72) Inventor: Takafumi Kishi, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 841 days.

(21) Appl. No.: 17/075,536

(22) Filed: Oct. 20, 2020

(65) Prior Publication Data

US 2021/0036044 A1 Feb. 4, 2021

Related U.S. Application Data

(63) Continuation of application No. PCT/JP2019/016760, filed on Apr. 19, 2019.

(30) Foreign Application Priority Data

Apr. 27, 2018 (JP) .................................. 2018-087519

(51) Int. Cl.
H01L 27/146 (2006.01)

(52) U.S. Cl.
CPC .. *H01L 27/14636* (2013.01); *H01L 27/14618* (2013.01); *H01L 27/14683* (2013.01)

(58) Field of Classification Search
CPC ......... H01L 27/14636; H01L 27/14618; H01L 27/14683

USPC .......................................................... 257/434
See application file for complete search history.

(56) References Cited

U.S. PATENT DOCUMENTS

| 2002/0051068 A1 | 5/2002 | Murayama | |
|---|---|---|---|
| 2014/0091421 A1* | 4/2014 | Ikeya | H01L 27/14618 257/459 |
| 2016/0104738 A1* | 4/2016 | Luan | H01L 27/14625 257/432 |

FOREIGN PATENT DOCUMENTS

| CN | 101165894 A | 4/2008 |
|---|---|---|
| CN | 106031161 A | 10/2016 |
| EP | 0790653 A2 | 8/1997 |
| JP | H03-241842 A | 10/1991 |
| JP | 2005-268602 A | 9/2005 |
| JP | 2015-012211 A | 1/2015 |
| JP | 2017-037204 A | 2/2017 |
| WO | 2015/099140 A1 | 7/2015 |

* cited by examiner

*Primary Examiner* — Jami Valentine Miller
(74) *Attorney, Agent, or Firm* — CANON U.S.A., INC. IP Division

(57) ABSTRACT

An image capturing unit includes a plurality of input wiring lines for controlling the semiconductor chip, a plurality of first electrodes connecting to the input wiring lines, and an input connector connecting to the input wiring lines. The substrate includes a first area for mounting an electronic component in an opposite surface on which the semiconductor chip is mounted and a second area for use in mounting the semiconductor chip. The connector is disposed in the first area. At least one or more of the first electrodes are disposed in the second area.

16 Claims, 12 Drawing Sheets

IMAGE CAPTURING UNIT AND METHOD FOR MANUFACTURING THE SAME

CROSS-REFERENCE TO RELATED APPLICATIONS

This application is a Continuation of International Patent Application No. PCT/JP2019/016760, filed on Apr. 19, 2019, which claims the benefit of Japanese Patent Application No. 2018-087519, filed on Apr. 27, 2018 both of which are hereby incorporated by reference herein in their entirety.

BACKGROUND OF THE DISCLOSURE

Field of the Disclosure

The aspect of the embodiments relates to an image capturing unit using an image sensor.

Background Art

In general structure of known image sensors used in digital cameras, a sensor chip comprising a silicon substrate and others is mounted within a package formed of ceramic or plastic with a recessed cavity. However, as packages have decreased in weight and size, a so-called packageless structure as disclosed in PTL 1 is proposed in which a sensor chip is mounted directly on a printed circuit board made of glass epoxy or the like.

CITATION LIST

Patent Literature

PTL 1: Japanese Patent Laid-Open No. 2015-012211

However, as disclosed in PTL 1, the packageless structure needs to heat the printed circuit board in connecting the sensor chip and the printed circuit board with wire bonding. This has a problem in that an area of the printed circuit board in which components can be disposed is decreased.

Furthermore, an electrical inspection is needed after the sensor chip is mounted. This requires an additional terminal for inspection on the printed circuit board, causing the problem of increasing the board size. Furthermore, providing the terminal for inspection to output lines operating at high-speed clock will add a stub to the output line, and thus may degrade the quality of the output signal.

In an aspect, the disclosure provides an image capturing unit with a packageless structure that allows an optimum inspection of the sensor chip in a manufacturing process and an inspection process without decreasing the signal quality.

SUMMARY OF THE DISCLOSURE

An image capturing unit according to the aspect of the embodiments is an image capturing unit including a semiconductor chip constituting an image sensor and a substrate on which the semiconductor chip is mounted. The image capturing unit is characterized by including a plurality of input wiring lines for controlling the semiconductor chip, a plurality of first electrodes connecting to the input wiring lines, and an input connector connecting to the input wiring lines. The substrate includes, in an opposite surface from a surface on which the semiconductor chip is mounted, a first area for mounting an electronic component and a second area for use in mounting the semiconductor chip. The connector is disposed in the first area. At least one or more of the first electrodes are disposed in the second area.

Further features of the disclosure will become apparent from the following description of exemplary embodiments with reference to the attached drawings.

DESCRIPTION OF THE EMBODIMENTS

Embodiments of the disclosure will be described hereinbelow with reference to the drawings. In all of the drawings, components having the same function are denoted by the same reference sign, and a repeated description thereof will be omitted. The components are not limited to the details of the embodiments and can be corrected as appropriate.

First Embodiment

Figure 1:
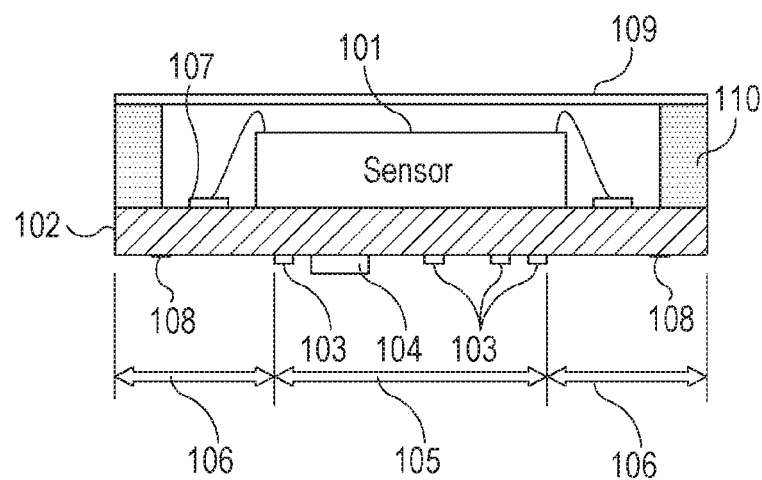
FIG. 1 is a diagram illustrating the configuration of an image capturing unit according to an embodiment of the disclosure.

FIG. 1 is a diagram illustrating, in outline, the configuration of an image capturing unit of an embodiment of the disclosure.

Reference sign 101 denotes a sensor chip that outputs an image signal according to incident light. In the present embodiment, the sensor chip 101 is a semiconductor chip, such as a complementary metal-oxide semiconductor (CMOS) image sensor, formed on a silicon substrate. Alternatively, the sensor chip 101 may be a charge-coupled device (CCD) sensor or an image sensor made of a semiconductor other than silicon. The aspect of the embodiments is suitable for the configuration of the sensor chip 101 including multiple input and output signal lines and is more suitable for laminated image sensors in which a signal processing chip for signal processing is laminated on an imaging chip including a photoelectric conversion unit that converts light to electricity.

Reference sign 102 denotes an imaging substrate. In the present embodiment, the imaging substrate 102 is a printed circuit board, on which components 103 (described later) are disposed. The individual patterns on the imaging substrate 102 are made of metal with low electric resistance, such as gold and copper, and are electrically connected to the sensor chip 101 using wire bonding wiring or the like using gold wires or the like. The imaging substrate 102 is preferably a rigid substrate and is made of glass epoxy or the like in consideration of stability for mounting the sensor chip 101. However, this is not intended to limit the aspect of the embodiments. The imaging substrate 102 may be a flexible substrate made of a plastic material or a low-temperature co-fired ceramic (LTCC) substrate made of ceramic and copper wires. In other words, the imaging substrate 102 may be any substrate in which patterns made of a metal wire, such as a copper wire, is formed on a specific material and on which the components can be mounted. The printed circuit board may be a substrate including a plurality of layers composed of different materials that are made conducting through vias or the like.

Reference sign 103 denotes an electronic component. The electronic components 103 include discrete components, such as capacitors, resistors, and coils, necessary for operating the sensor chip 101. The electronic components 103 further include IC chips, such as regulators for supplying power for operating the sensor chip 101 and an oscillator that supplies a clock signal. The electronic components 103 may include other components not for use in operating the sensor chip 101, such as a thermometer that monitors the state of the sensor chip 101 and a memory that stores the individual information on the sensor chip 101. The electronic components 103 are generally mounted on the opposite surface of the imaging substrate 102 from the sensor chip 101. Alternatively, a capacitor for removing noise, and so on may be mounted on the same surface such as that of the sensor chip 101 because they are preferably close to connection terminals.

Reference sign 104 denotes a connector including a plurality of electrical contacts. An example is a board-to-board (B-to-B) connector, which is a component for transferring power and signals between the imaging substrate 102 and an external substrate including a signal processing chip for processing captured signals obtained from the sensor chip 101, to which various signals are connected in a lump. The connector may be a connector for connecting a flexible substrate. The connector 104 is mounted on the opposite surface of the imaging substrate 102 from the sensor chip 101. If the number of terminals that need to be connected to the external substrate increases with an increase in the function of the sensor chip 101, the size of the connector 104 will also increase. In this case, a plurality of connectors 104 are preferably used to connect to the external substrate.

Referring to FIG. 1, the range on the imaging substrate 102 indicated by arrow 105 is an area that substantially coincides with the back of the sensor chip 101, indicating a component area in which the components 103 and the connector 104 are disposed. The range indicated by arrow 106 is an area around the component area 105, indicating a forbidden area in which the electronic components 103 and the connector 104 are not disposed. To drive the sensor chip 101, multiple components are necessary and need to be densely packed close in a narrow range. However, the imaging substrate 102 can be deformed due to heat or the like, and the electronic components 103 are preferably mounted not in the peripheral portion, which is significantly affected by the deformation, but in the vicinity of the back of the sensor chip 101. In the present embodiment, the component area 105 corresponds to the first area, and the forbidden area 106 corresponds to the second area. It is preferable to provide wire bonding pads 107 (described later) on the opposite surface from the area corresponding to the forbidden area 106.

Figure 2A:
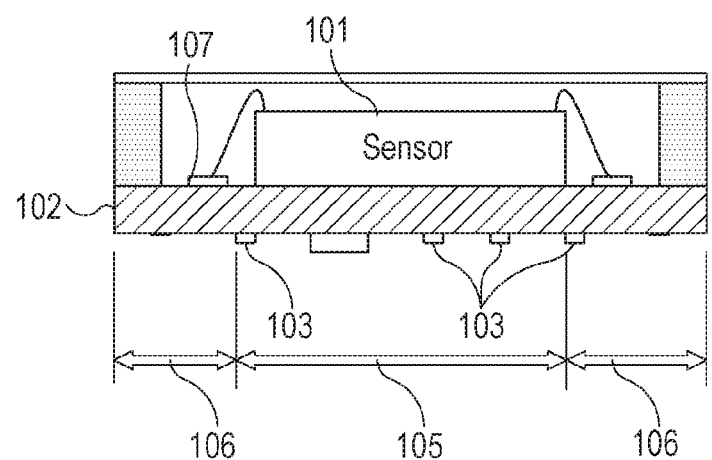
FIG. 2A is a diagram illustrating another configuration of the image capturing unit according to the embodiment of the disclosure.
Figure 2B:
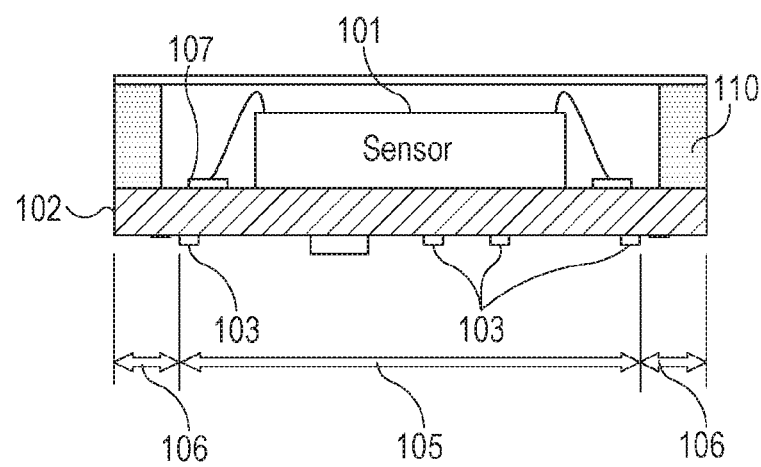
FIG. 2B is a diagram illustrating another configuration of the image capturing unit according to the embodiment of the disclosure.

Referring to FIG. 2, the configuration of an image capturing unit according to an embodiment of the disclosure, different from the configuration in FIG. 1, will be described. In FIG. 2A, the component area 105 is larger than the back of the sensor chip 101. This is a configuration in the case where the components 103 for driving the sensor chip 101 are large in number or size. In FIG. 2B, the component area 105 increases in size and is larger than the area in which the wire bonding pad 107 is disposed. In the disclosure, the size of the component area 105 is not limited as long as the imaging substrate 102 can be hold in heating or manufacturing the wire bonding pad 107. The component area 105 and the forbidden area 106 are determined depending on the size of the sensor chip 101, the number of components 103, and so on.

Referring back to FIG. 1, reference sign 107 denotes a wire bonding pad for connecting the sensor chip 101 and the imaging substrate 102 together by wire bonding with gold wires or the like. Specifically, the wire bonding pad 107 is an electrode formed on the surface of the imaging substrate 102 by surface treatment, such as gold plating. The wire bonding pad 107 is disposed on the same surface of the imaging substrate 102 such as that of the sensor chip 101.

Reference sign 108 denotes a check pad (hereinafter sometimes referred to as CP), which is an electrode formed on the surface layer of the imaging substrate 102, like the wire bonding pad 107, by, for example, gold, copper, aluminum, or solder plating. The CPs 108 are disposed on the same surface of the imaging substrate 102 such as that of the connector 104.

The area on the imaging substrate 102 indicated by arrow 106 is a heating area to which a heater or the like is to be brought into contact to heat the wire bonding pads 107 in wire bonding. The area 106 is also used to fix and position the imaging substrate 102 in manufacturing the image capturing unit, in addition to heating the wire bonding pads 107. In other words, the forbidden area 106 needs only have an area necessary for a fixing holder or the like to come into contact. The outer shape of the imaging substrate 102 increases or the component area 105 for the components decreases as the area of the forbidden area 106 increases. For that reason, more specifically, the forbidden area 106 is preferably inside the outer periphery of the imaging substrate 102 by about 1 mm to 8 mm. The component area 105 is preferably the same area as the outer periphery of the sensor chip 101 or the outer periphery of the substrate inside the sensor chip 101 by about 0 mm to 5 mm Although the forbidden area 106 is preferably disposed along the four sides of along the outer periphery of the imaging substrate 102, this is not essential. For example, the forbidden area 106 may be disposed on one side or two sides along the outer periphery of the imaging substrate 102, and each areas can be of different sizes and/or shapes as long as the fixing holder can be brought into contact.

Reference sign 109 denotes a cover glass for sealing the sensor chip 101. The cover glass 109 has an antireflection coat and an infrared cut coat. The cover glass 109 may have the effect of an optical low-pass filter. Reference sign 110 denotes a frame, which is formed around the outer periphery of the wire bonding pads 107. The frame 110 is bonded to the imaging substrate 102 and the cover glass 109 to seal the sensor chip 101. The sides of the frame 110 do not need to be perpendicular to the imaging substrate 102 and have a predetermined inclination to suppress the reflection of the sides. The frame 110 is formed of resin or the like but may be formed of a ceramic material, a metallic material, or combination thereof. The frame 110 may include a fixing unit made of metal or the like for fixing to the main body of the image capturing apparatus, described later.

Figure 3A:
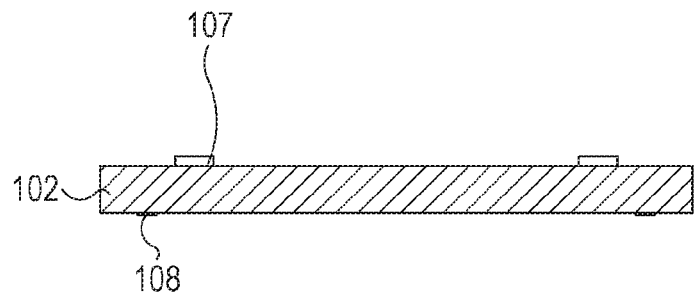
FIG. 3A is a diagram illustrating the manufacturing procedure of the image capturing unit according to the embodiment of the disclosure.

Next, the procedure of manufacture (assembly) of the image capturing unit will be described. FIG. 3 is a diagram illustrating, in outline, the manufacturing procedure of an image capturing unit of an embodiment of the disclosure. FIG. 3A illustrates a state of only the imaging substrate 102, in which the components 103 and so on are not mounted. The assembly is performed, with the imaging substrate 102, which is a combination of a plurality of substrates, fixed to a predetermined jig, such as a tray (omitted in FIG. 3A). The wire bonding pads 107 and the CPs 108 are formed on the imaging substrate 102, as described above. Patterns for mounting the components 103 and wires connecting the components are also formed (not illustrated).

Figure 3B:
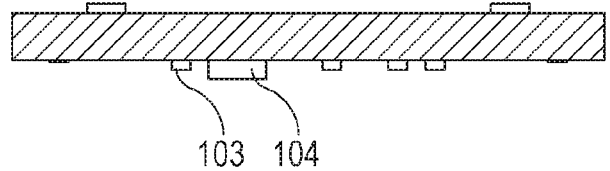
FIG. 3B is a diagram illustrating the manufacturing procedure of the image capturing unit according to the embodiment of the disclosure.

FIG. 3B illustrates a state in which the components 103 and the connector 104 are mounted on the imaging substrate 102. The components are mounted on the imaging substrate 102 by reflow soldering or the like in which it is coated with cream solder or the like using a predetermined mask. The wire bonding pads 107 may be surface-treated using a sputtering technique.

Figure 3C:
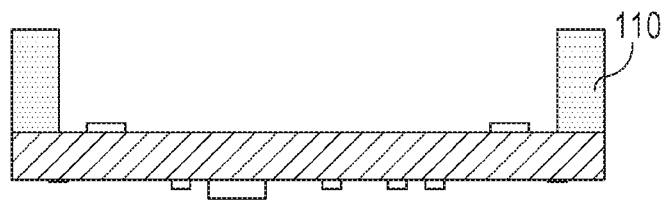
FIG. 3C is a diagram illustrating the manufacturing procedure of the image capturing unit according to the embodiment of the disclosure.
Figure 3D:
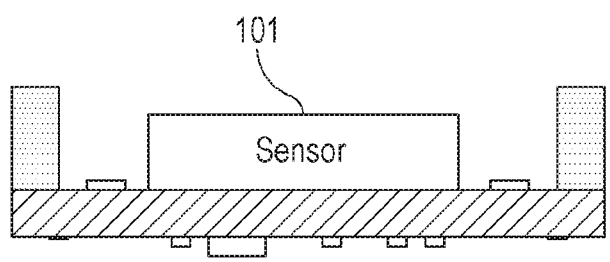
FIG. 3D is a diagram illustrating the manufacturing procedure of the image capturing unit according to the embodiment of the disclosure.
Figure 3E:
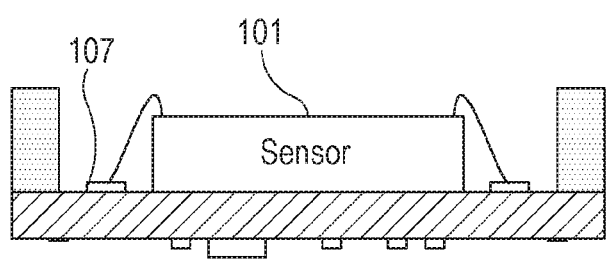
FIG. 3E is a diagram illustrating the manufacturing procedure of the image capturing unit according to the embodiment of the disclosure.
Figure 3F:
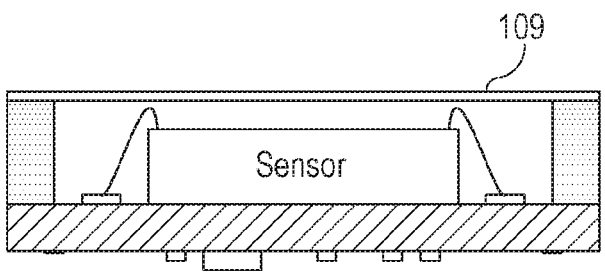
FIG. 3F is a diagram illustrating the manufacturing procedure of the image capturing unit according to the embodiment of the disclosure.

FIG. 3C illustrates a state in which the frame 110 is bonded to the imaging substrate 102. The bonding is performed using a photo-curable resin or the like, but any other method can be used in the disclosure. FIG. 3D illustrates a state in which the sensor chip 101 is mounted on the imaging substrate 102. The sensor chip 101 is fixed to the imaging substrate 102 with an adhesive (not illustrated). FIG. 3E illustrates a state in which the sensor chip 101 and the wire bonding pads 107 are bonded by wire bonding. In the wire bonding operation for connecting the sensor chip 101 and the imaging substrate 102, the sensor chip 101 and the imaging substrate 102 are heated on a heat stage to melt metal for use in wire bonding. Lastly, in FIG. 3F, the sensor chip 101 is sealed with the cover glass 109, so that the image capturing unit is assembled.

The image capturing unit in the present embodiment checks whether the image capturing unit manufactured in the manufacturing procedure illustrated in FIG. 3 can normally operate (generate electrically normal signals). The image capturing unit supplies power and clock to the sensor chip 101 and determines whether a predetermined signal is output (specifically described later). If an expected signal is output, the image capturing unit is determined to be a non-defective item, and if not, the image capturing unit is determined to be a defective item. The sensor chip 101 mounted in the image capturing unit of the present embodiment is inspected for operation also in a wafer state before assembling. The details of inspection in the wafer state is the same as the inspection of the image capturing unit, described later. In other words, the sensor chip 101 is inspected twice. This is because the sensor chip 101 is heated during wire bonding and is brought into contact with various components during the assembly process, as described with reference to FIG. 3, and in the sequence of operations, the sensor chip 101 can fail especially before being sealed with the cover glass 109. For this reason, it is necessary to check whether the image capturing unit normally operates after being assembled. An image capturing unit with a cavity structure is sealed with the cover glass 109 before being mounted on a printed circuit board to which multiple electronic components are mounted. This allows for pre-mounting inspection at the stage of a small package. However, when image capturing units with a packageless structure are inspected after being sealed with the cover glass 109, the inspection is performed with the inclusion of the printed circuit board. In this case, not only the sensor chip 101 but also the imaging substrate 102 and the other electronic components are inspected. In some cases, the size of the image capturing unit is relatively large, which requires a simple configuration for inspection.

Figure 4:
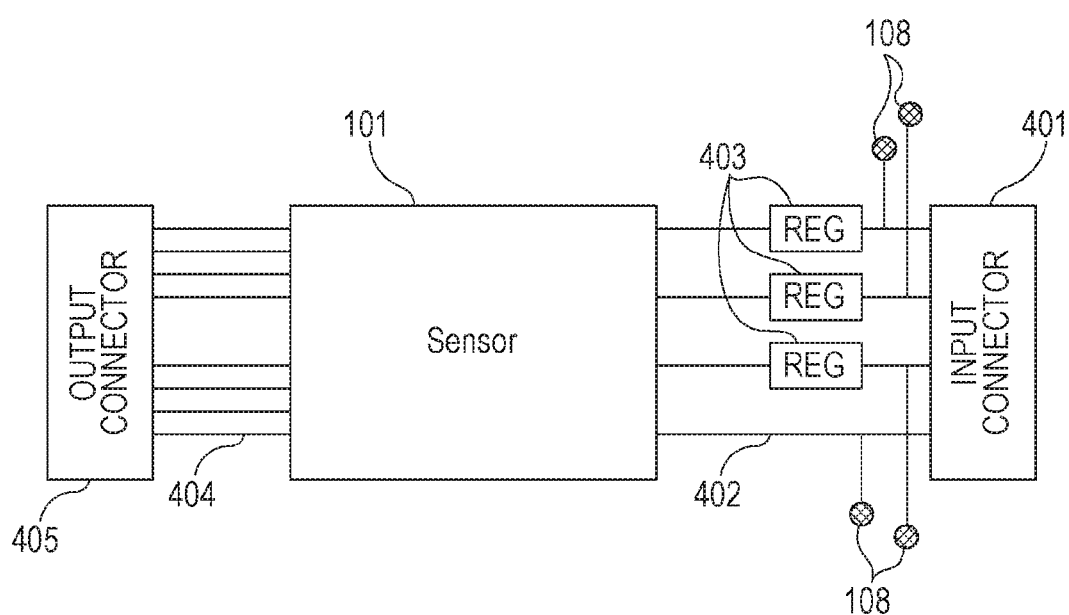
FIG. 4 is a block diagram of an image capturing unit according to an embodiment of the disclosure.
Figure 5:
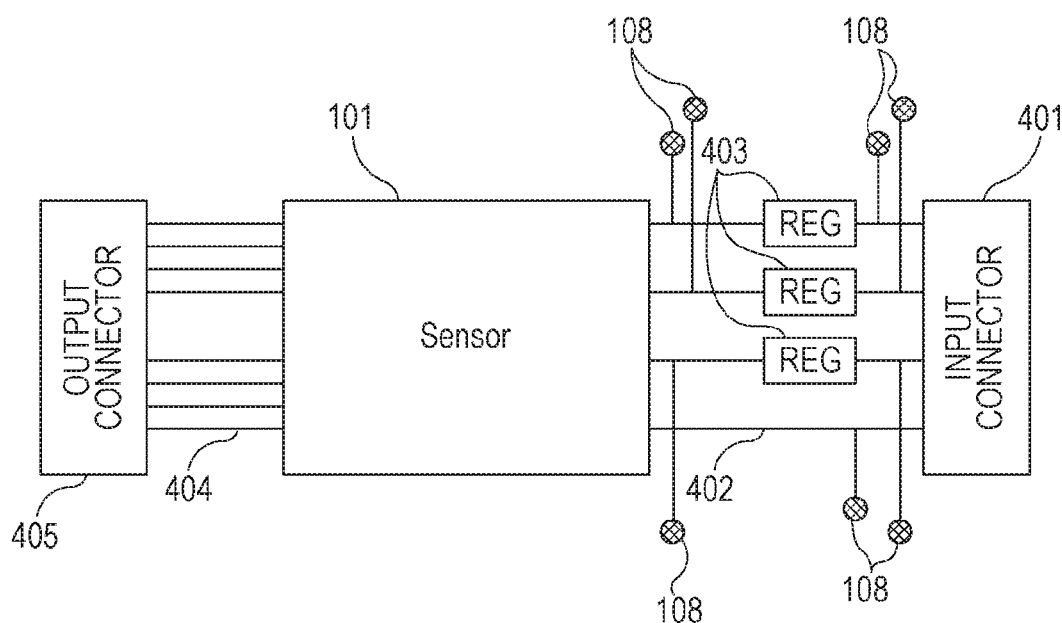
FIG. 5 is another block diagram of an image capturing unit according to an embodiment of the disclosure.
Figure 6:
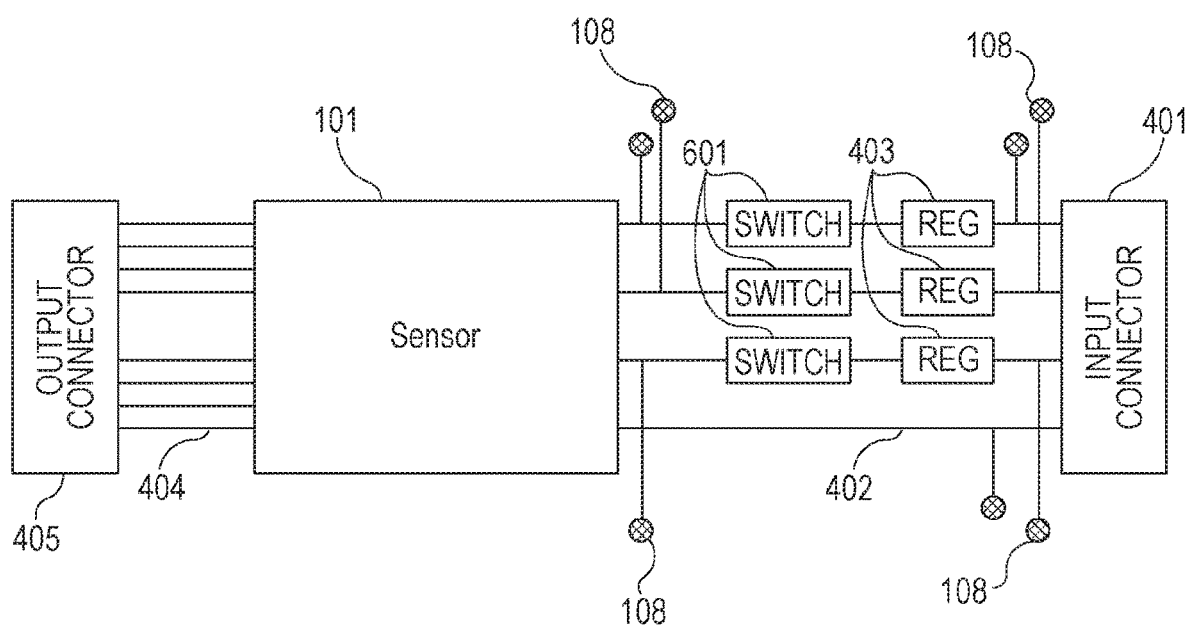
FIG. 6 is another block diagram of an image capturing unit according to an embodiment of the disclosure.

Referring next to FIGS. 4 to 6, a circuit block diagram for the CPs 108 for use in inspection and connection of the components will be described.

FIG. 4 illustrates, in outline, the signal relationship of an image capturing unit according to an embodiment of the disclosure. Reference sign 401 denotes an input connector of the connector 104. The input connector 401 is a connector for connecting to an external substrate including a control unit that controls the sensor chip 101 so that it captures images, to which signals for driving the sensor chip 101 are connected. The signals for driving the sensor chip 101 in the present embodiment include a clock signal, a synchronization signal, a serial communication signal, and a power source. The signals input from input connector 401 are input to the sensor chip 101 through input wiring lines 402 wired on the imaging substrate 102. Part of the power supply circuit for driving the sensor chip 101 can supply stable power to the sensor chip 101 using linear regulators 403 disposed in intermediate points of the wires 402. The linear regulators 403 are not absolutely necessary. Power may be directly supplied via the input connector 401. The number of signals connected to the input connector 401 is about ten.

Reference sign 405 denotes an output connector of the connector 104. The output connector 405 is a connector for connecting to an external substrate including a signal processing unit for generating image data from an output signal from the sensor chip 101, to which serial signal lines and so on for outputting signals are connected. The output signals from the sensor chip 101 in the present embodiment include not only pixel signals from the pixels but also information on the output pixel signals (addresses, attributes, and so on of the pixels), a header or footer, synchronous code, and a clock signal for receiving image signals. Furthermore, if the sensor chip 101 includes a process circuit for correcting or calculating the obtained image signals, the processing result may be output as output signals. The signals output to the output connector 405 are output from the sensor chip 101 through the output wiring lines 404 wired on the imaging substrate 102. Since the signals from the sensor chip 101 require high-speed transmission, the output wiring lines 404 are differential serial signal lines conforming to the low-voltage differential signaling (LVDS) standard or the scalable low-voltage signaling (SLVS) standard. The number of output channels from the sensor chip 101 is 20, and 40 signal lines are wired at equal length on the imaging substrate 102.

The CPs 108 are connected to the corresponding input wiring lines 402 between the input connector 401 and the sensor chip 101 via predetermined wires. In other words, the sensor chip 101 can be driven via the CPs 108 without connecting the input connector to an external substrate including a control unit. While the details of control of the sensor chip 101 using the CPs 108 will be described later, the CPs 108 are mainly used to execute electrical inspection of the sensor chip 101 without using the input connector 401 in inspecting the image capturing unit. In contrast, it is preferable not to connect the CPs 108 to the differential pair wiring lines of the output wiring lines 404. This is for the purpose of preventing the signal quality of the output signals from the sensor chip 101 from decreasing because the output signals from the sensor chip 101 are higher than the input signals, and connecting the CPs 108 to the output wiring lines 404 forms stub wiring.

Referring to FIG. 5, the signal relationship of an image capturing unit according to ab embodiment of the disclosure, different from that of FIG. 4, will be described. In FIG. 5, the CPs 108 are connected also in the wiring lines between the linear regulators 403 and the sensor chip 101. This configuration allows for inputting inspection voltages other than the voltages generated by the linear regulators 403 to the sensor chip 101. Since the linear regulators 403 are components for supplying voltages for the normal operation of the sensor chip 101, this configuration is needed for inspection using another voltage. For example, by applying a high voltage or a low voltage, the sensor chip 101 can be operated in an inspection drive mode, or by applying a reverse bias, inspection in an abnormal state can be performed. However, if the voltages input to the sensor chip 101 via the CPs 108 exceed the rated voltages of the linear regulators 403, the linear regulators 403 are damaged. For this reason, the voltage range is limited, and this configuration is advantageous for inspection in which the voltage range is not significantly changed.

Referring next to FIG. 6, the signal relationship of an image capturing unit according to an embodiment of the disclosure, different from those of FIG. 4 and FIG. 5, will be described. In FIG. 6, switches 601, which are switch circuits, are disposed between the linear regulators 403 and the sensor chip 101. This configuration allows for applying various voltages from the outside via the CPs 108 between the sensor chip 101 and the switches 601. In the case of FIG. 6, the power applied from the outside to the linear regulators 403 via the switches 601 can be separated. This allows the voltage to be applied to the sensor chip 101 via the CPs 108 to be set in a wide range without being limited by the power-supply voltages of the linear regulators 403 or the like. Signals and power for controlling the switches 601 can be provided by being input via the CPs 108 likewise.

By connecting the CPs 108 to the input signals of the sensor chip 101, and not connecting the CPs 108 to the output signals, as has been described with reference to FIGS. 4 to 6, signals necessary for inspection can be input to the sensor chip 101, with the signal quality of the output signals kept. This also allows power necessary for the inspection of the sensor chi 101 to be easily applied from the outside.

Referring next to FIG. 7, the connection relationship among the contacts in inspection and in normal usage will be described. FIG. 7 illustrates, in outline, the connection relationship in the inspection and the usage of an image capturing unit of an embodiment of the disclosure.

Figure 7A:
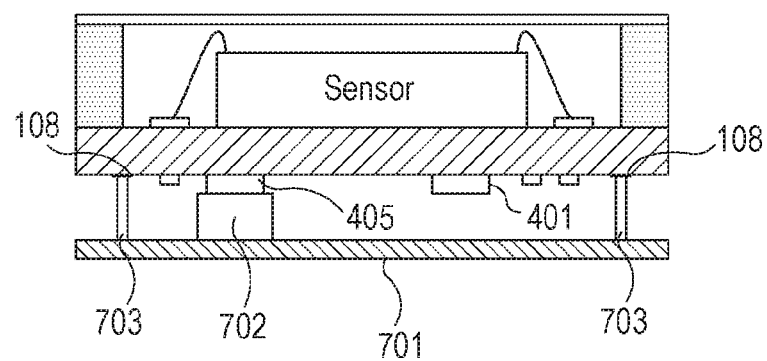
FIG. 7A is a diagram illustrating the configuration of connection to an image capturing unit of an embodiment of the disclosure.

FIG. 7A is a diagram illustrating the connection relationship in the inspection of the image capturing unit. Reference sign 701 denotes an interface substrate of an inspection apparatus. The image capturing unit is attached to the substrate for inspection. The interface substrate 701 supplies signals for driving the sensor chip 101 via the CPs 108 and receives output signals via the output connector 405. Reference sign 702 denotes an inspection connector, which is connected to the output connector 405. General B-to-B connectors perform holding to prevent dropping after being combined. In contrast, the interface substrate 701 includes dedicated non-holding components to repeatedly attach and detach a plurality of image capturing units. Reference sign 703 denotes an inspection pin, which is connected to the CP 108 when the image capturing unit is attached to the interface substrate 701. The inspection pin 703 is an extendable contact, which can establish electrical conduction by being pushed against the CP 108. The inspection pin 703 is used to supply a signal and power for driving the sensor chip 101.

Figure 7B:
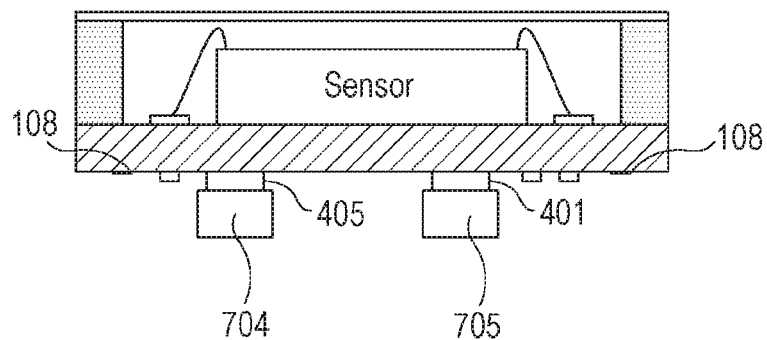
FIG. 7B is a diagram illustrating the configuration of connection to an image capturing unit of an embodiment of the disclosure.

FIG. 7B is a diagram illustrating the connection relationship of the image capturing unit in normal use. "In normal use" indicates a case in which the image capturing unit is installed in an image capturing apparatus (described later) and is used in an operation for capturing a subject image through a lens. Reference sign 704 denotes a first connector to be connected to the output connector 405, and reference sign 705 denotes a second connector to be connected to the input connector. When the image capturing unit is installed in an image capturing apparatus or the like, the image capturing unit is connected to another substrate via the first connector 704 and the second connector 705. The first connector 704 and the second connector 705 are mounted on different substrates (not illustrated). The input connector 401 and the output connector 405 are precise electronic components but certainly have dimensional errors in mass production. Furthermore, adding the accuracy of mounting to the imaging substrate 102, the accuracy of the flatness of the imaging substrate 102 itself, and so on may cause the dimensions to deviate from a dimensional range for normal engagement. For these reasons, mounting the first connector 704 and the second connector 705 on the same substrate would not ensure normal engagement because of their tolerances. To prevent it, the first connector 704 and the second connector 705 are preferably disposed on different substrates and are individually connected. Alternatively, the same substrate may be used, as long as it is a flexible substrate that can accommodate the tolerances.

For inspection, the image capturing unit is attached to the inspection apparatus using an automatic transfer machine or the like in consideration of adhesion of dust and an electrostatic discharge failure. In this case, in order to automatically connect the first connector 704 and the second connector 705, the connectors are preferably disposed on a single substrate. However, this may not ensure the engagement of the connectors, as described above. Disposing the connectors on different substrates or a flexible substrate will require a mounting transfer machine with a complicated structure and increase the inspection time. In other words, when a plurality of image capturing units are to be inspected using one inspection apparatus, two connectors cannot be used, decreasing the productivity.

Accordingly, even in the configuration including two or more connectors, using only the output connector 405 at the time of inspection, and using the CPs 108 in inputting to the sensor chip 101, as described above, ensures connection using a very simple transfer machine. This has the advantageous effect of enabling stable inspection in a short tact time.

Referring next to FIG. 8, the two-dimensional positional relationship among the component area 105 and the area 106 of the imaging substrate 102 and the CPs 108 will be described. FIGS. 8 to 11 are diagrams illustrating, in outline, the layout of an imaging substrate of an embodiment of the disclosure.

Figure 8A:
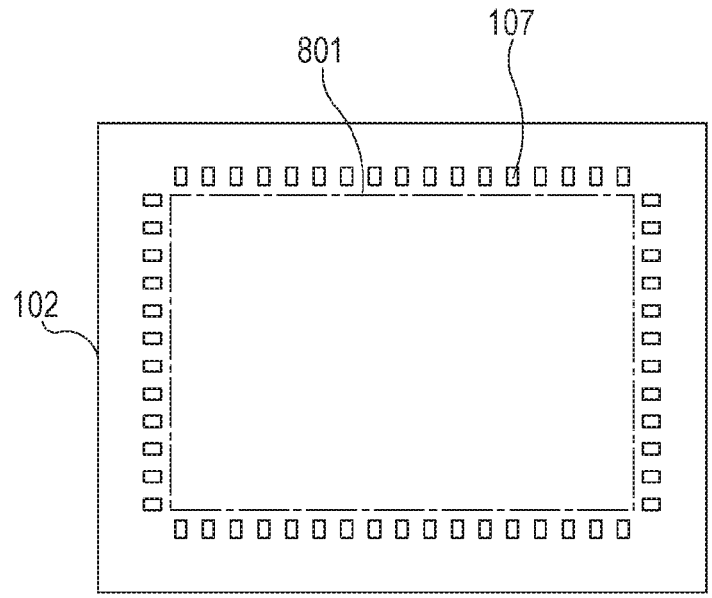
FIG. 8A is a diagram illustrating the layout of an imaging substrate according to an embodiment of the disclosure.
Figure 8B:
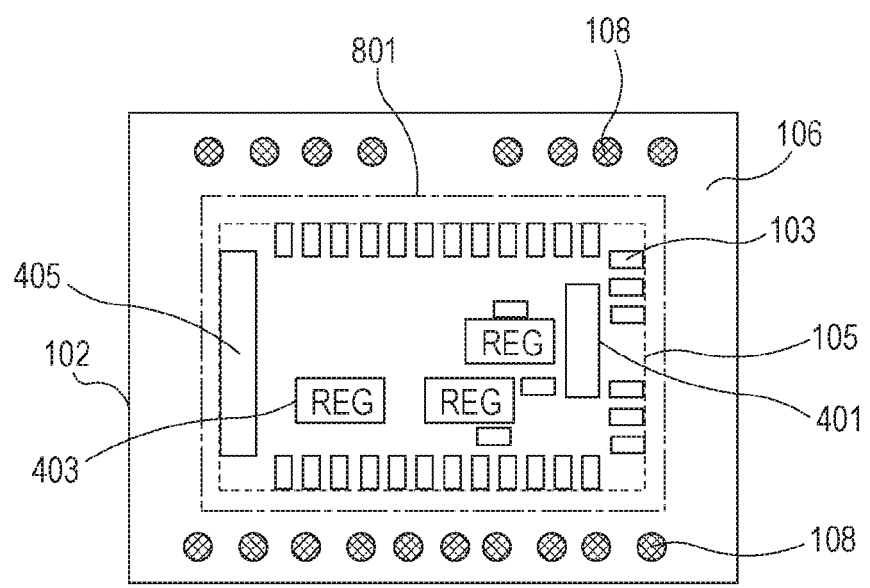
FIG. 8B is a diagram illustrating the layout of the imaging substrate according to the embodiment of the disclosure.

FIG. 8A illustrates the layout of the surface (front) of the imaging substrate 102 on which the sensor chip 101 is mounted. FIG. 8B illustrates the layout of the surface (back) of the imaging substrate 102 on which the components 103 are disposed. Reference sign 801 denotes an area in which the sensor chip 101 is disposed. The wire bonding pads 107 are disposed around the sensor chip 101.

On the back of the imaging substrate 102 on which the components are disposed, the input connector 401, the output connector 405, the components 103, and so on are disposed in the component area 105. The area 106 is outside the component area 105 and extends to the end of the imaging substrate 102. Here, the image-sensor area 801 is illustrated also in the layout of the back of the substrate on which the components 103 are disposed for simplicity sake. However, the sensor chip area 801 is not actually present on the front of the substrate on which the components are disposed. Although the component area 105 is described as an area smaller than the sensor chip 101, as illustrated in FIG. 1, the aspect of the embodiments is not limited to this configuration.

The CPs 108 are disposed in the area 106, as described above. The CPs 108 are most preferably disposed on one or more sides depending on the number of CPs 108. Disposing the CPs 108 on the long side of the image sensor rather than the short side can increase the area for the CPs 108.

Figure 9:
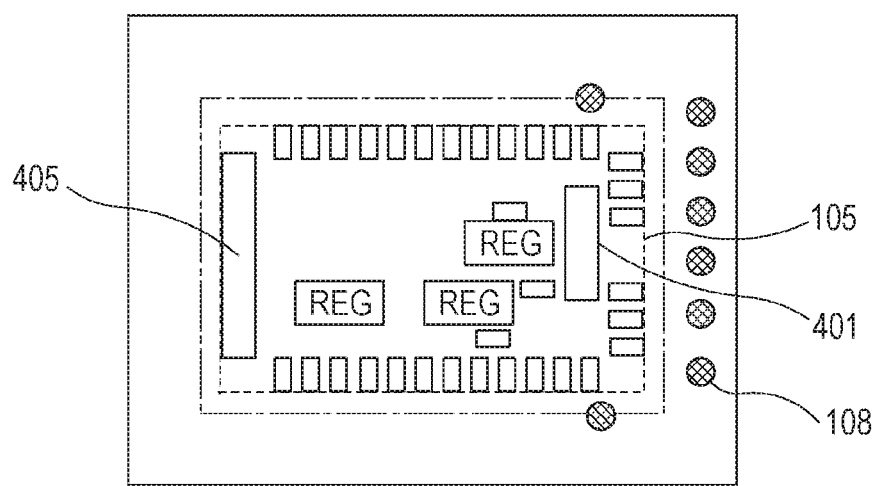
FIG. 9 is a diagram illustrating another layout of an imaging substrate according to an embodiment of the disclosure.

FIG. 9 illustrates another example of the arrangement of the CPs 108, in which the CPs 108 are disposed on the side symmetric about the direction in which the output connector 405 is disposed. The arrangement illustrated in FIG. 9 allows the pressure applied to the imaging substrate 102 when the inspection connector 702 and the inspection pins 703 are pushed against the image capturing unit at the inspection described above to be made uniform. The uniform pressure prevents the components from being damaged and increases the stability to conduction of the contacts.

Figure 10:
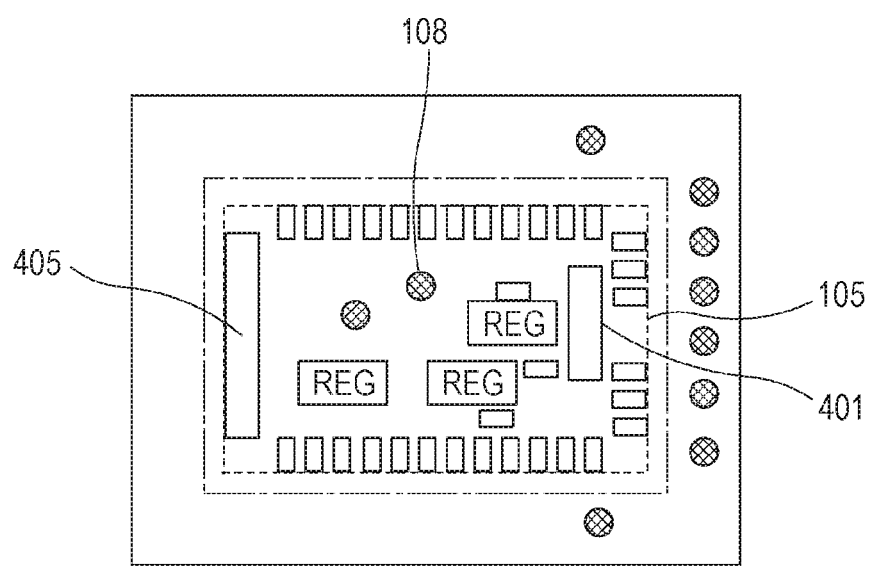
FIG. 10 is a diagram illustrating another layout of an imaging substrate according to an embodiment of the disclosure.

FIG. 10 illustrates another example of the arrangement of the CPs 108, some of which are disposed also in the component area 105. For example, in the case of the wiring in FIG. 5 or FIG. 6, it may be preferable to dispose the CPs 108 near the output of the linear regulators in terms of performance. In such a case, the CPs 108 is preferably disposed in the component area 105. However, disposing the CPs 108 in the component area will decrease the area of the component area 105 for the components 103. For this reason, also even in the case where the CPs 108 are disposed in the component area, the number of CPs 108 in the area 106 is preferably larger than the number of CPs in the area 105.

Figure 11:
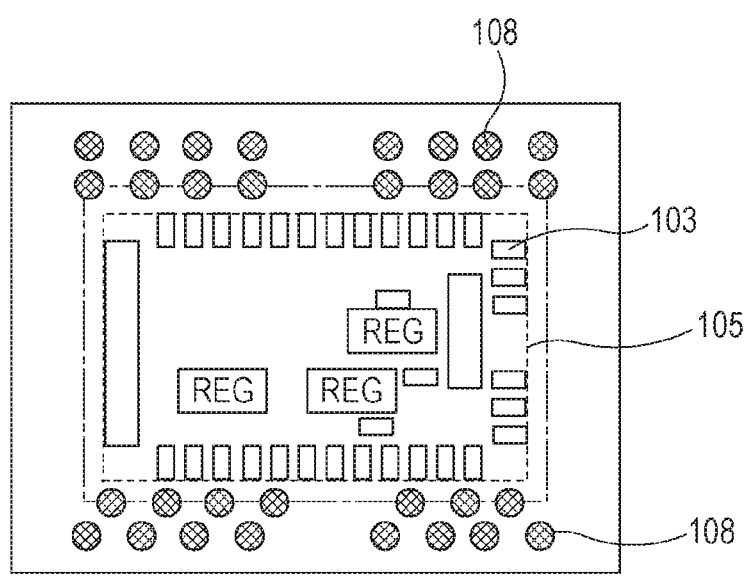
FIG. 11 is a diagram illustrating another layout of an imaging substrate according to an embodiment of the disclosure.

FIG. 11 illustrates another example of the arrangement of the CPs 108, illustrating a case in which the CPs 108 are arranged in multiple rows and a case in which they are arranged in a staggered pattern. However, disposing multiple rows of CPs 108 are arranged, as in the drawing, can increase the area of the area 106 and decrease the area of the component area 105, which is advantageous when the area 106 is sufficiently large.

Disposing many of the CPs 108 in the area 106 allows for not only suitably disposing the component area 105 but also providing the area 106 on the periphery of the substrate. This also contributes to the stability to conduction during inspection. This also allows for suitably supporting the substrate in heating during wire bonding and manufacturing.

Disposing the CPs 108 not for the output connector 405 through which high-speed signal lines pass but only for input signals allows for inspection in the case of two connectors and allows inspection without decreasing the output signal quality. This also allows for supplying a voltage necessary for inspection to the sensor chip 101 without being influenced by the voltages of the linear regulators.

Figure 12:
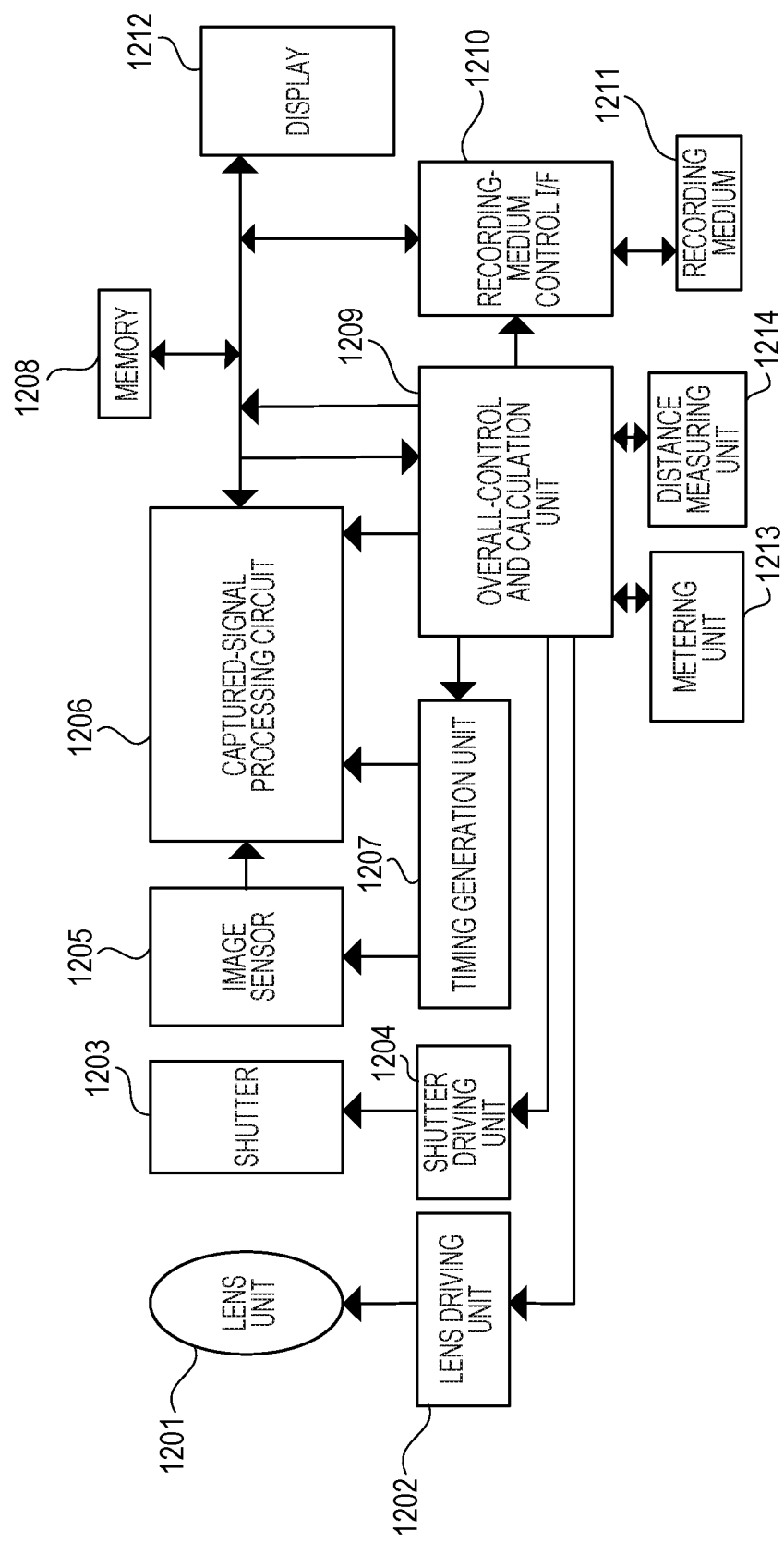
FIG. 12 is a block diagram of an image capturing apparatus according to an embodiment of the disclosure.

Referring next to FIG. 12, an embodiment in which the image sensor described in the above embodiments is applied to a digital camera, which is an image capturing apparatus, will be described in detail.

In FIG. 12, reference sign 1201 denotes a lens unit that forms an optical image of the subject on an image sensor 1205 including the sensor chip 101, of which zoom control, focus control, aperture control and so on are performed by a lens driving unit 1202. Reference sign 1203 denotes a mechanical shutter, which is controlled by a shutter control unit 1204. Reference sign 1205 denotes an image sensor for receiving an image of the subject formed by the lens unit 1201 as an image signal. Reference sign 1206 denotes a captured-signal processing circuit that performs various corrections on the image signal output from the image sensor 1205 or compresses data.

Reference sign 1207 denotes a timing generation circuit which is a driving unit that outputs various timing signals to the image sensor 1205 and the captured-signal processing circuit 1206, reference sign 1209 denotes a control circuit that performs various kinds of calculation and controls the entire image capturing apparatus, and reference sign 1208 denotes a memory for temporarily storing image data. Reference sign 1210 denotes an interface for recording or reading to or from a recording medium, 1211 denotes a detachable recording medium, such as a semiconductor memory, for recording or reading image data, and 1212 denotes a display that displays various pieces of information and captured images. Reference sign 1213 denotes a metering unit that detects the luminance of the subject. Reference sign 1214 denotes a distance measuring unit that detects a focus.

As has been described above, the sensor chip 101 is mounted on the imaging substrate 102, and the imaging substrate 102 is connected to a substrate on which the captured-signal processing circuit 1206 and the timing generation unit 1207 are mounted via the connector.

Next, the operation of the digital camera with the above configuration during shooting will be described.

When the main power source is turned on, the power source of the control system is turned on, and the power source of the image capturing circuit, such as the captured-signal processing circuit 1206, is turned on.

Then, when a release button (not illustrate) is pressed, a high-frequency component is taken out on the basis of a signal output from the distance measuring unit 1214 to calculate the distance to the subject with the control circuit 1209. Thereafter, the lens unit is driven by the lens driving unit 1202, and it is determined whether the subject is in focus. If it is determined that the subject is not in focus, the lens unit is driven again, and distance measurement is performed.

After focusing is confirmed, an image capturing operation is started.

After completion of the image capturing operation, an image signal output from the sensor chip 101 is processed by the captured-signal processing circuit 1206, and the signal is written to the memory 1208 by the control circuit 1209. The data accumulated in the memory 1208 is recorded in the detachable recording medium 1211, such as a semiconductor memory, via the recording-medium control I/F 1210 under the control of the control circuit 1209.

The image may be directly input to a computer or the like via an external I/F for processing.

The aspect of the embodiments provides an image capturing unit with a packageless structure that allows an optimum inspection of a sensor chip in a manufacturing process and an inspection process without decreasing the signal quality.

OTHER EMBODIMENTS

The image capturing units and image capturing apparatuses described in the embodiments are applicable to various applications. For example, the image capturing units can be used in sensing not only visible light but also infrared light, ultraviolet light, X-rays, and other light. The image capturing apparatuses are typified by digital camera but may be used for mobile phones with a camera, such as smartphones, monitoring cameras, and game machines. The image capturing apparatuses can also be used for endoscopes, angiographic medical devices, cosmetic devices for observing skin or scalps, and video cameras for capturing sports and action moving images. The image capturing apparatuses can also be used for traffic cameras for traffic or vessel monitoring, such as drive recorders, academic-application cameras for astronomical observation or analyte observation, home electric appliances with camera, machine vision, and so on. In particular, the machine vision is applicable not only in robots in factories or the like but also in agriculture and fishery.

The configurations of the image capturing apparatuses in the above embodiments are mere examples, and the configurations of the image capturing apparatuses to which the disclosure can be applied are not limited to the configuration illustrated in FIG. 1. The circuit configurations of the components of the image capturing apparatuses are not limited to the configurations illustrated in the drawings.

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

The above-described embodiments merely illustrate examples of embodiment in implementing the disclosure. Accordingly, the technical scope of the disclosure should not be limitedly interpreted based on the embodiments. That is, the disclosure can be implemented in variety forms within the technical idea and primary features of the disclosure.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

The invention claimed is:

1. An image capturing unit comprising a semiconductor chip constituting an image sensor and a substrate on which the semiconductor chip is mounted, the image capturing unit comprising:
   a plurality of input wiring lines for controlling the semiconductor chip;
   a plurality of first electrodes connecting to the input wiring lines; and
   an input connector connecting to the input wiring lines,
   wherein the substrate includes a first area and a second area on a first surface opposite to a second surface on which the semiconductor chip is mounted,
   wherein the input connector and an electronic component are disposed in the first area, and at least one or more of the plurality of first electrodes are disposed in the second area, and
   wherein the semiconductor chip can be driven via the plurality of first electrodes.

2. The image capturing unit according to claim 1, further comprising an output connector connecting to an output wiring line for outputting an image signal that is from the semiconductor chip.

3. The image capturing unit according to claim 2, wherein the output wiring line connecting to the output connector comprises differential pair wiring lines for transmitting a high-speed signal.

4. The image capturing unit according to claim 2, wherein the input connector or the output connector is a board-to-board connector.

5. The image capturing unit according to claim 1,
   wherein the substrate includes, in the second surface, a second electrode to be connected to the semiconductor chip with wire bonding,
   wherein the second electrode is disposed on an area opposite to the second area.

6. The image capturing unit according to claim 1, wherein the first area and an area of the second surface on which the semiconductor chip is mounted are substantially coincide in size and position.

7. The image capturing unit according to claim 1, comprising:
   one or more power supply circuits in wiring lines connecting the input connector and the semiconductor chip,
   wherein the plurality of first electrodes are connected to wiring lines between the power supply circuit and the semiconductor chip and to wiring lines between the power supply circuit and the input connector.

8. The image capturing unit according to claim 7, wherein the wiring lines between the power supply circuit and the semiconductor chip to which the plurality of first electrodes connect include a switch circuit.

9. The image capturing unit according to claim 1, wherein the second area is provided on the outer periphery of the substrate.

10. The image capturing unit according to claim 1, wherein the second area is a heating area for performing wire bonding of the semiconductor chip.

11. The image capturing unit according to claim 1, wherein:
   the plurality of first electrodes are provided in each of the first area and the second area, and
   the first electrodes provided in the first area is smaller in number than the first electrodes provided in the second area.

12. The image capturing unit according to claim 1, wherein the plurality of first electrodes are disposed on two sides of four sides on the periphery of the substrate.

13. The image capturing unit according to claim 1, wherein the plurality of first electrodes are disposed on longer sides of four sides on the periphery of the substrate.

14. A method for manufacturing an image capturing unit including a semiconductor chip constituting an image sensor and a substrate on which the semiconductor chip is mounted, the method comprising the steps of:
   providing a plurality of first electrodes on a peripheral portion of the substrate, the plurality of first electrodes connecting to a plurality of input wiring lines for controlling the semiconductor chip;
   providing an input connector connecting to the plurality of input wiring lines for controlling the semiconductor chip;
   mounting an electronic component on a first area of a first surface of the substrate; and
   mounting the semiconductor chip on a second surface of the substrate opposite to the first surface,
   wherein the plurality of first electrodes are provided on a second area different from the first area on the first surface of the substrate, and
   wherein the semiconductor chip can be driven via the plurality of first electrodes.

15. The method for manufacturing an image capturing unit according to claim 14, further comprising the steps of:
   sealing the substrate on which the semiconductor chip is mounted with a cover glass; and
   inspecting the semiconductor chip in a state in which the semiconductor chip is sealed with the cover glass,
   wherein, in the step of inspecting, the semiconductor chip is controlled using the plurality of first electrodes.

16. An image capturing apparatus comprising an image capturing unit including:
   a semiconductor chip constituting an image sensor;
   a substrate on which the semiconductor chip is mounted;
   a plurality of input wiring lines for controlling the semiconductor chip;
   a plurality of first electrodes connecting to the input wiring lines; and
   an input connector connecting to the input wiring lines,
   wherein the substrate includes a first area and a second area on a first surface opposite to a second surface on which the semiconductor chip is mounted,
   wherein the input connector and an electronic component are disposed in the first area, and at least one or more of the plurality of first electrodes are disposed in the second area, and
   wherein the semiconductor chip can be driven via the plurality of first electrodes.

* * * * *